United States Patent
Nojo

(10) Patent No.: US 8,235,503 B2
(45) Date of Patent: Aug. 7, 2012

(54) SEMICONDUCTOR ELEMENT CHIP, INK JET HEAD EMPLOYING SEMICONDUCTOR ELEMENT CHIP, AND METHOD FOR BONDING ELECTRODES OF SEMICONDUCTOR ELEMENT CHIP

(75) Inventor: Naruyuki Nojo, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 858 days.

(21) Appl. No.: 12/326,381

(22) Filed: Dec. 2, 2008

(65) Prior Publication Data

US 2009/0160908 A1    Jun. 25, 2009

(30) Foreign Application Priority Data

Dec. 20, 2007    (JP) .................. 2007-328707

(51) Int. Cl.
*B41J 2/01* (2006.01)

(52) U.S. Cl. .................................................... 347/50

(58) Field of Classification Search .................... 347/50
See application file for complete search history.

(56) References Cited

U.S. PATENT DOCUMENTS

| 4,494,688 A | 1/1985 | Hatada et al. ................. 228/180 |
| 6,472,249 B1 | 10/2002 | Kuwabara ..................... 438/106 |
| 2009/0315948 A1* | 12/2009 | Imamura et al. ................ 347/50 |

FOREIGN PATENT DOCUMENTS

| JP | S64-018735 U | 1/1989 |
| JP | 2003-007765 A | 1/2003 |
| KR | 2001-70023 | 7/2001 |

* cited by examiner

*Primary Examiner* — Jerry Rahll
(74) *Attorney, Agent, or Firm* — Fitzpatrick, Cella, Harper & Scinto

(57) ABSTRACT

A semiconductor element substrate includes an electrode pad; a semiconductor element; and a connection heater for heating the electrode pad, wherein the connection heater is disposed in a range capable of heating the electrode pad up to a level capable of electrical connection.

3 Claims, 8 Drawing Sheets

SEMICONDUCTOR ELEMENT CHIP, INK JET HEAD EMPLOYING SEMICONDUCTOR ELEMENT CHIP, AND METHOD FOR BONDING ELECTRODES OF SEMICONDUCTOR ELEMENT CHIP

FIELD OF THE INVENTION AND RELATED ART

The present invention relates to a semiconductor element chip, an ink jet head employing a semiconductor element chip, and a method for bonding flying leads to the electrodes of a semiconductor element chip.

In the field of an apparatus which uses semiconductor, there have been known those which use a flexible wiring sheet, such as TAB (Tape Automated Bonding) and FPC (Flexible Printed Circuit) in order to achieve a higher level of integration.

FIG. 8 is a schematic drawing of the electrical junction between the semiconductor element chip and the flexible wiring sheet. FIG. 8A is plan view of the electrical junction, and FIG. 8B is a sectional view of the electrical junction at a line E-E in FIG. 8B.

Referring to FIGS. 8A and 8B, designated by a referential number 101 is a semiconductor element chip made up of silicon (Si) or the like, and designated by a referential number 102 is a flexible wiring sheet having flying leads 105. The flying lead 105 is a type of electrode, and is an integral part of the patterned electrical wiring of the flexible wiring sheet 102. The flexible wiring sheet 102 has a rectangular device hole 103 for accommodating the semiconductor element chip 101. The semiconductor element chip 101 is placed in the rectangular device hole 103, and solidly attached to a supporting member 109. The layer of the flexible wiring sheet 102 is a flat base film 104 formed of dielectric resin, such as polyimide. The flying lead 105 is formed by bonding metallic foil made of an electrically conductive metallic substance, such as copper, on the downwardly facing surface (in FIG. 8B) of the flat base film 104, and etching the metallic foil in the desired pattern by photolithography. After the etching process, the downwardly facing surface of the flying lead 105 is plated with gold, tin, solder, or the like. Further, the metallic areas of the downwardly facing surface of the flexible wiring sheet 102, which are not to be exposed, are covered with a layer 108 of resist or the like. It is also during the above described process that the inner wiring (unshown), outer leads (unshown), etc., of the flexible wiring sheet 102 are formed. The outer leads of the flexible wiring sheet 102 are the electrode pads for electrically connecting the flexible wiring sheet 102 to the main assembly of the apparatus.

Further, the flying lead 105 is formed so that it extends inward of the rectangular device hole 103, from the flexible wiring sheet 102. The semiconductor element chip 101 is provided with multiple electrode pads 106, which are on the top surface of the substrate of the semiconductor element chip 101. The electrode pads 106 are made of aluminum or the like. Each electrode pad 106 has electrical connection with the tip portion of the corresponding flying lead 105, which extends inward of the device hole 103 of the flexible wiring sheet 102, with the presence of a stud bump 107 between the tip portion of the flying lead 105 and the electrode pad 106.

More specifically, the electrode pad 106 is provided with the stud bump 107, which is a projection formed, in advance, of a metallic substance, such as gold, on the top surface of the electrode pad 106. As for the means for establishing electrical connection between a flying lead 105 and the corresponding electrode pad 106, first, the tip portion of the flying lead 105 is to be placed on the stud bump 107 of the electrode pad 106, and then, the tip portion is to be pressed on the stud bump 107 with the use of a bonding tool (unshown), so that the flying lead 105 is bonded to the stud bump 107 to establish electrical connection between the flying lead 105 and electrode pad 106.

During the above described bonding process, the supporting portion 109, to which the semiconductor element chip 101 and flexible wiring sheet 102 are firmly held, is kept firmly held to a bonding stage by suction or the like, in order to ensure that the satisfactory electrical connection is made between the semiconductor element chip 101 and flexible wiring sheet 102. Further, the entire work pieces involved in the bonding process are kept heated in order to efficiently bond the flying leads 105 to the stud bumps 107.

As for the method for heating the abovementioned work pieces involved in the bonding process, it is a common practice to heat the pieces using the thermal conduction caused by placing the pieces in contact with a heating block. However, this method is problematic in that if the pieces cannot be placed perfectly in contact with the heating block, or in the like situations, heat does not efficiently conduct from the heating block to the work pieces. As for the solution to this problem, it is possible to employ the heating method disclosed in Japanese Laid-open U.M. Application S64-18735, for example. According to this application, an apparatus for assembling an apparatus which employs semiconductor elements is provided with a heating light source and a light condensing portion (focusing portion), and the above described process of making satisfactory electrical connection between the flying lead 105 and electrode pad 106 is carried out while radiantly heating the semiconductor element chip 101 and flying lead 105.

Incidentally, bonding processes, such as the one described above, are commonly called an ILB (Inner Lead Bonding).

The ILB processes can be roughly divided into two groups. One of the two groups is called a gang bonding, and the other is called a single-point bonding. In the case of gang bonding, all the flying leads of a flexible wiring sheet, or all the flying leads extending any one of the edges of the flexible wiring sheet, and the corresponding stud bumps, are connected all at once, one for one, with the use of a bonding tool. In the case of the single-point bonding, the flying leads of a flexible wiring sheet and the corresponding stud bumps are selectively, individually, and sequentially connected, one for one.

Whether the gang bonding method or the single-point bonding method is used, the portions to be connected are kept highly heated while being connected. More specifically, in a case where flying leads are bonded to the corresponding stud bumps by the gang bonding method, the bonding tool needs to be heated to roughly 500° C., whereas in a case where the single-point bonding method is used, the work pieces must be heated to roughly 200° C. In either case, the hot bonding tool or work pieces are pressed upon the flying lead(s) placed on the electrode pads to weld the leads and pads to each other at their interface.

Generally speaking, the coefficient of linear expansion of the base film 104 (formed of primarily organic dielectric resin) and that of the flying lead 105 (formed of Cu (copper)) are extremely large compared to that of the substrate of the semiconductor element chip 101 (formed of Si (silicon) or the like. Therefore, even if a given electrode (electrode pad 106) on the semiconductor element chip 101 is perfectly in alignment with (perfectly in contact with) the corresponding flying lead 105 before they are heated, they sometimes become misaligned from each other with the progression of the thermal expansion of the flexible wiring sheet 102.

One of the solutions to the above-described problem is disclosed in Japanese Laid-open Patent Application 2003-7765. According to this application, the flying lead pitch is set in consideration of the amount of thermal expansion of the base film 104. Also disclosed in this application is to form a flying lead wider than the amount of displacement of the flying lead relative to the stud bump to compensate for the displacement.

In recent years, it has been increasingly desired to reduce a flexible wiring sheet in size, while the number of the points of bonding on a flexible wiring sheet has been steadily increasing. However, the semiconductor element chip size is determined by the cost of the semiconductor element chip to some degree. Therefore, it is required to reduce the electrical contact pitch. In order to reduce the electrical contact pitch, the electrode pad pitch has to be reduced in size, which in turn requires to reduce the stud bump in size. In order to reduce the stud bump size, the flying lead has to be reduced in width. The reduction in width of the flying lead reduces the contact area between flying lead and electrode stretch.

In a case where a group of flying leads which is extremely small in pitch is bonded to the corresponding group of electrode pads which also is extremely small in pitch, with the use of the ILB process, a flying lead having expanded due to the heat from the ILB process sometimes comes into contact with the electrode pad located next to the electrode pad to which the flying lead is to be bonded.

Further, both the flexible wiring sheet and semiconductor element chip are heated while being immovably held to the supporting member. Therefore, the flying leads of the flexible wiring sheet are bonded to the electrodes pad of the semiconductor element chip while remaining thermally expanded. After the completion of the bonding process, the flexible wiring sheet and semiconductor element chip are allowed to cool down to the normal temperature. Further, there is the stud bump between each flying lead and the corresponding electrode pad, and this stud bump also is heated during the bonding process. Thus, as the area of bonding between the stud bump and electrode pad cools down, stress occurs in the area of bonding due to the difference in coefficient of liner expansion between the semiconductor element chip and flexible wiring sheet. This stress concentrates to the interface between the electrode pad and the corresponding stud bump, and also, the interface between the stud bump and the corresponding flying lead, sometimes causing the electrode pad to separate from the stud bump and/or the flying lead to separate from the stud bump (breaking electrical connection).

As the above-described point of electrical connection is reduced in pitch, the flying leads are likely to be reduced in width. Thus, the stress which occurs during the abovementioned cooling period has to be absorbed by the narrower flying leads. In other words, the stress has to be absorbed by the smaller area of contact, which is lower in bonding strength. Therefore, the flying lead and electrode pad are likely to easily separate from each other.

Further, in recent years, ink jet printers have been increased in image quality as well as speed. In other words, they have been increased in the number of holes through which droplets of ink are jetted out, and also, in the hole density. In other words, they have been increased in the number of recording elements for jetting droplets of ink, number of elements for driving the recording elements, etc., in addition to the number of ink jetting holes, which in turn has increased the number of wires and electrical contacts on the semiconductor element chip.

However, in the case of an apparatus employing a semiconductor element chip, more specifically, an ink jet printer, which is required to jet ink droplets at a high level of accuracy, the semiconductor element chip and flexible wiring sheet have to be immovably attached to the supporting portion in advance. Therefore, problems similar to those described above occur.

SUMMARY OF THE INVENTION

The present invention was made in consideration of the above-described problems. Thus, the primary object of the present invention is to provide a semiconductor element chip which can prevent the unsatisfactory bonding between an flying lead of a flexible wiring sheet and the corresponding electrode pad of a semiconductor element chip, which is attributable to the difference in the coefficient of linear expansion between the flying lead and electrode pad, and an ink jet head employing such a semiconductor element chip.

Another object of the present invention is to provide a method for bonding the electrode of a semiconductor element chip and the flying lead of a flexible wiring sheet.

According to an aspect of the present invention, there is provided a semiconductor element substrate comprising an electrode pad; a semiconductor element; and a connection heater for heating said electrode pad, wherein said connection heater is disposed in a range capable of heating said electrode pad up to a level capable of electrical connection.

According to another aspect of the present invention, there is provided an ink jet head comprising the semiconductor element substrate of the first aspect, an ejection energy generating element, provided on said semiconductor element, for generating energy effective to eject recording liquid; and an electric wiring member, provided with an electrical contact for electrical connection with said electrode pad, for applying an electrical pulse to said energy generating element.

According to a further aspect of the present invention, there is provided an electrical connection method for a semiconductor element substrate provided thereon with an electrode pad, a stud bump on the electrode pad, a semiconductor element, said method comprising a step of providing a flying lead above said stud bump without contacting thereto; a step of providing a connection heater for heating said electrode pad in a range capable of heating said electrode pad up to a level capable of electrical connection; a step of energizing said connection heater; and a step of pressing the flying lead against said electrode pad.

According to a further aspect of the present invention, there is provided a connecting method for connecting a first electrode of a first member and a second electrode of a second member with each other, said method comprising a step of providing said first member with heating means for heating the first electrode; then a step of heating the first electrode up to a predetermined temperature by said heating means; and then a step of connecting the first electrode and the second electrode.

The present invention makes it possible to provide: a semiconductor element chip which can prevent the unsatisfactory bonding between its electrode pads and the corresponding inner leads of a flexible wiring sheet, which is attributable to the difference in the coefficient of linear expansion between the substrate of the semiconductor element chip and the flexible wiring sheet (inner leads); an ink jet head employing such a semiconductor chip; and a method for bonding the electrodes of such an semiconductor element chip to the inner leads of a flexible wiring sheet.

The electrical junction to which the present invention is related is the electrically conductive junction between the electrode pads of a semiconductor element chip and the corresponding flying leads of a flexible wiring sheet, or the structural arrangement which makes it possible to form the electrical junction. In a case where the material of an electrode pad and that of a flying lead are such that the electrode pad and flying lead can be directly bonded to each other, it is unnecessary to place another piece of material between the electrode pad and flying lead. That is, placing another piece of material between the electrode pad and flying lead is not the primary intent of the present invention. However, when it is preferable to place another piece of material capable of making it easier to bond the electrode pad and flying element to each other, between the electrode pad and flying lead, such a piece of material, for example, a stud bump, may be placed between the electrode pad and flying lead.

These and other objects, features, and advantages of the present invention will become more apparent upon consideration of the following description of the preferred embodiments of the present invention, taken in conjunction with the accompanying drawings.

DESCRIPTION OF PREFERRED EMBODIMENTS

The present invention, which will be described with reference to preferred embodiments of the present invention is a method for bonding the first electrode, that is, the electrode which a first member, for example, a semiconductor element chip, has, and a second electrode, that is, the flying lead which a second member, for example, a wiring sheet, has. More specifically, the first member is provided with a heating means dedicated to the heating of the electrodes of the first member, and when bonding the electrode of the first member to the electrode of the second member to establish electrical connection between the two electrodes, the electrode of the first member is heated to a preset temperature level with the use of the heating means. In other words, the electrode of the first member and that of the second member are bonded after the electrode of the first member is heated to the temperature level at which the two electrodes are satisfactorily bondable.

Embodiment 1

Figure 1A:
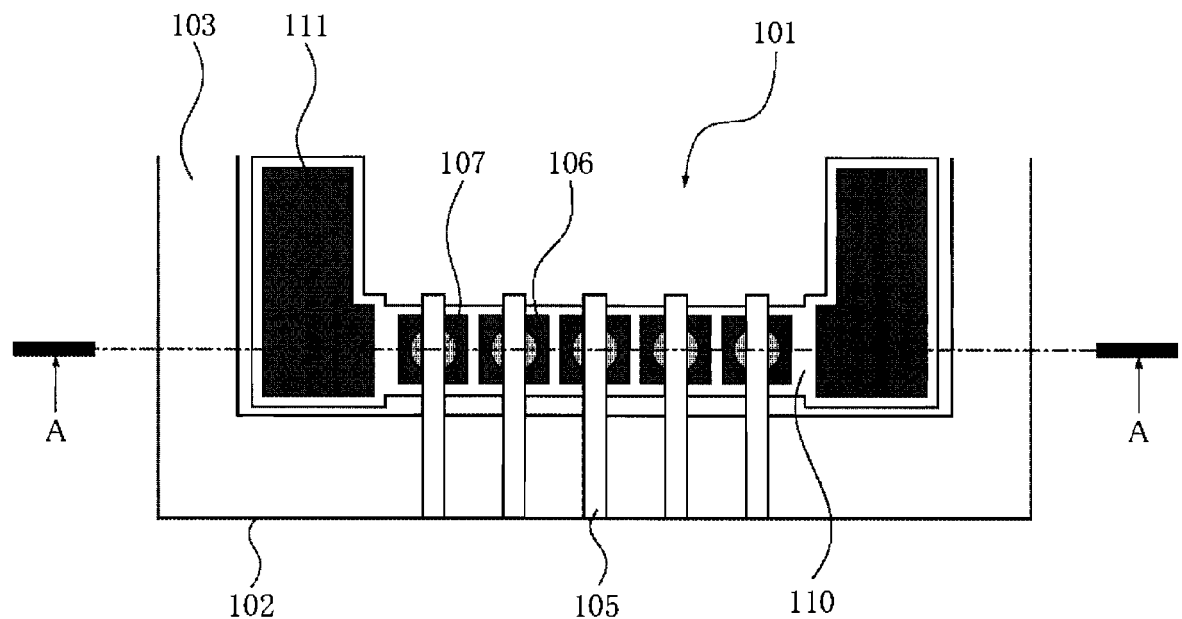
FIG. 1 is a schematic drawing of the electrical junction between the electrode pads of the semiconductor element chip and the inner leads (flying lead) of the flexible wiring sheet, in the first embodiment of the present invention.
Figure 1B:
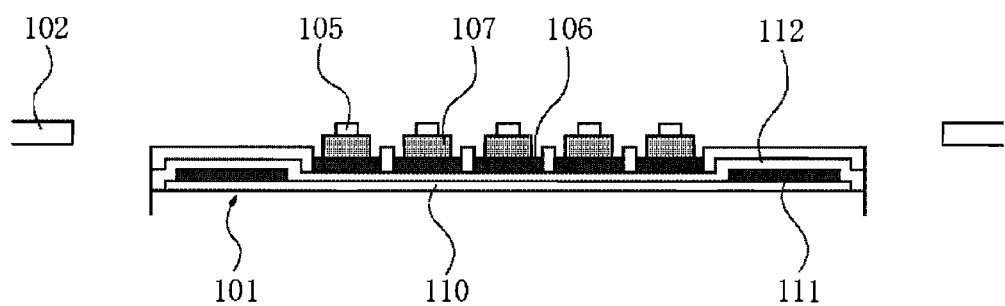

FIG. 1 is a schematic drawing of the electrical junction between the group of electrode pads of the semiconductor element chip and the corresponding group of inner lead (flying leads) of flexible wiring sheet, in the first preferred embodiment of the present invention. FIG. 1A is a plan view of the junction, and FIG. 1B is a sectional view of the junction at a line A-A in FIG. 1A.

Referring to FIGS. 1A and 1B, designated by a referential number 110 is a heater dedicated to the heating of electrode pads 106 when bonding the electrode pads 106 to the corresponding flying leads 105. The heater 110 is formed on the substrate of the semiconductor element chip 101, with the use of film forming technologies, so that it will be directly below, or roughly below, the electrode pads 106, with the placement of a dielectric layer 112 between the electrode pads 106 and heater 110. The heater 110 is within an area in which it can heat the electrode pads 106 to a temperature level at which they can be satisfactorily bonded to the flying leads 105, without negatively affecting the function of the semiconductor element chip 101. The dielectric layer 112 is formed of SiN or the like, which is used for forming semiconductor film. The heater 110, and the electrode pads 106 which are to be heated for bonding, are electrically insulated from each other by the dielectric layer 112. The heater 110 is made up of a heat generating resistive layer formed of TaSiN or the like, which generates heat as electricity is conducted through it, whereas an electrode layer (electrical wiring) formed of Al or the like, on the heat generating layer; multiple pairs of electrodes are formed on the heat generating layer, with the presence of intervals of a preset amount. As electric current is flowed through each pair of electrodes 111, the portion of the heat generating resistive layer, which is between the pair of electrodes 111, generates heat. The heater 110 is just an example of the heater for heating the electrode pads 106, and is not intended to limit the present invention in scope. That is, any metallic substance may be used as the material for the heater 110 as long as it is high in heat generation efficiency.

Figure 2A:
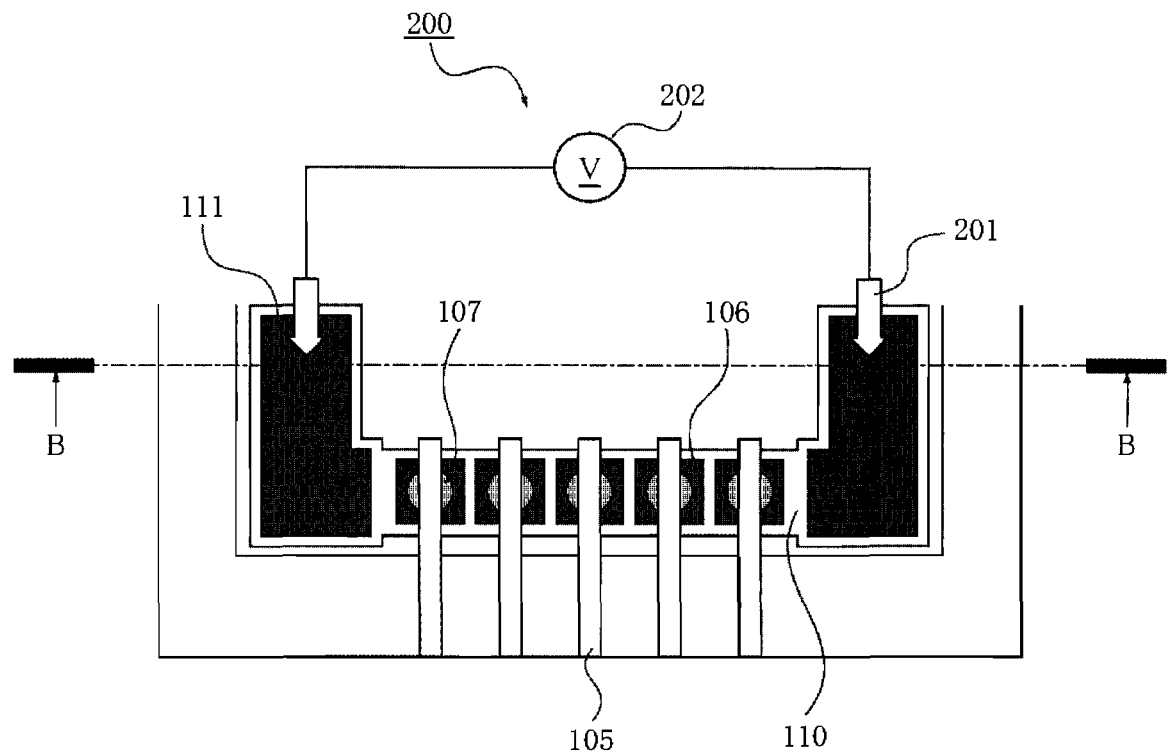
FIG. 2 is a schematic drawing of the electrical junction between the electrode pads of the semiconductor element chip and the inner leads (flying lead) of the flexible wiring sheet, and a part of the ILB apparatus 200, in the first embodiment of the present invention.
Figure 2B:
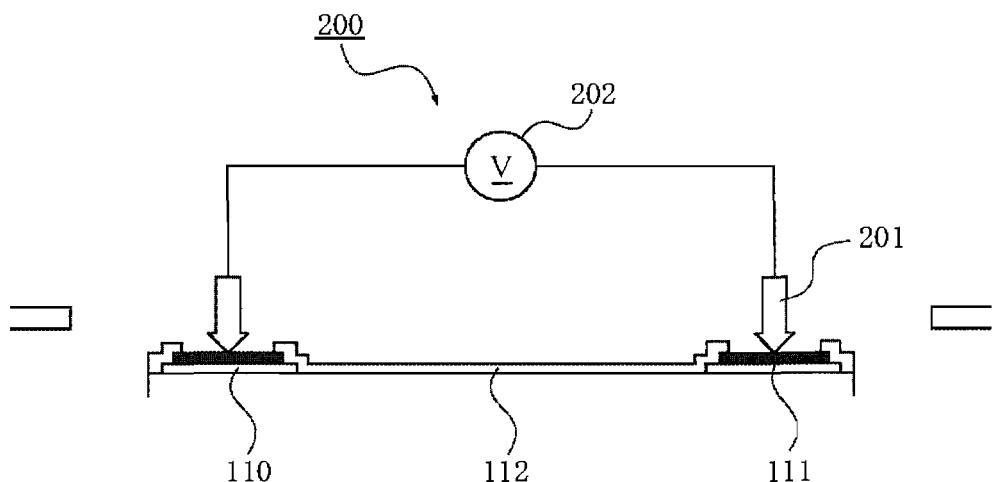

FIG. 2 is a schematic drawing of the electrical junction between the group of electrode pads 106 of the semiconductor element chip 101 and the group of flying leads 105 (inner leads) of the flexible wiring sheet 102, and a part of the ILB apparatus 200. FIG. 2A is a plan view of the electrical junction and the part of the ILB apparatus 200, and FIG. 2B is a sectional view of the electrical junction and the part of the ILB apparatus 200, at the line B-B in FIG. 2A.

Referring to FIGS. 2A and 2B, the ILB apparatus is provided with a contact electrode 201, which can be placed in contact with the heater electrodes 111 of the semiconductor element chip 101 to supply the heater 110 with power. The contact electrode 201 is provided with an electric power source 202 for supplying the contact electrode 201 with the electric power for making the heater 110 generate heat.

The procedure for making the electrode pad heater 110 generate heat is as follows:

The semiconductor element chip 101 and flexible wiring sheet 102 are positioned so that each flying lead 105 will be above the stud bump 107 of the corresponding electrode pad 106. The flying leads 105 are the parts of the electrical wiring member for supplying the electrode pad 106 of the semiconductor element chip 101 with external electrical signals, electric power for driving the semiconductor element chip 101, etc. They are attached to the flexible wiring sheet 102 in such a manner that they extend, as electrical leads, from the flexible wiring sheet 102.

At this stage of the procedure, the flying lead 105 and corresponding stud bump 107 have not been placed in contact with each other. Even if they have come into contact with each other, the contact is desired to be such that there is no heat conduction between the two. That is, it is desired that there is no contact between the two in practical terms. In other words, until immediately before the two are heated for bonding, the flying lead 105 is not heated, preventing thereby the problem that the flying lead 105 becomes deformed due to its thermal expansion (in particular, in its lengthwise direction).

Next, electrical power is supplied to the electrode pad heater 110 from the electric power source 202. Then, after the pad heater 110 reaches a preset temperature level (high enough to supply thermal energy for bonding of electrode pad 106 and flying lead 105 to each other), the bonding of the flying lead 105 to the electrode pad 106 is started while supplying the electrode pad heater 110 with the electric power so that the temperature of the junction between the pad heater 110 and flying lead 105 remains at the preset level. Then, the flying lead 105 is pressed toward the electrode pad 106, with the presence of the stud bump 107 on the electrode pad 106 between the flying lead 105 and electrode pad 106, with the use of a jig. During this step, unlike in the case of any of the conventional ILB, the flying lead 105 is not pressed by a highly heated bonding tool or work. Instead, the thermal energy necessary for the ILB is supplied from the bonding heater 110 located below the electrode pad 106. After the bonding of the stud bump 107 and flying lead 105 to each other is completed through the above described steps, the application of the voltage from the electric power source 202 is ended. Then, the contact electrode 201 of the ILB apparatus 200 is disconnected from the electrode 111 of the bonding heater 110, and the ILB apparatus 200 is moved away from the semiconductor element chip 101. The electric power supplied to the electrode 111 of the bonding heater 110 during the ILB step can be controlled in voltage value and/or current value as necessary so that thermal energy is supplied by the amount necessary for the proper ILB.

As described above, the electrode pad 106 is heated by the bonding heater 110 before the flying lead 105 is bonded to the electrode pad 106. Therefore, the flying lead 105 is not subjected to an excessive amount of heat. Therefore, it is possible to bond the flying lead 105 to the electrode pad 106 while there is virtually no deformation of the flying lead 105, which is attributable to thermal expansion. Therefore, it is possible to prevent the flying lead 105 from being unsatisfactorily bonded to the electrode pad 106. Further, the flying lead 105 is bonded while there is virtually no positional deviation of the flying lead 105. Therefore, it does not occur that even as the junction between the flying lead 105 and electrode pad 106 cools down, virtually no stress is generated in the junction; after the cooling of the junction, there is virtually no stress in the junction. Further, this procedure is easier in terms of the control of the temperature level at which the ILB process is carried out, and also, is greater in the amount of the heat which can be given to the electrode pad 106 and stud bump 107, being therefore shorter in the length time it takes to increase the temperature of the electrode pad 106 to the preset level, compared to any of the conventional procedures. Moreover, it does not occur that the flying lead 105 is unnecessarily heated. Therefore, this procedure is short in the length of time it takes for the junction to cool down. Thus, this procedure can reduce the length of time required for the ILB.

Further, while multiple inner leads are bonded to the corresponding electrodes, the inner lead bonding heater is kept on, and therefore, heat is continuously conducted to the flying leads 105 of the junctions created in the initial stage of the bonding, through the junctions. This heat conduction continues until the power supply to the bonding heater 110 is cut off after the entirety of the flying leads are bonded to the corresponding electrode pads 106. Therefore, the positional deviation of the flying lead 105 attributable to thermal expansion continues to occur in the completed junctions. However, the length of time it takes to bond a single flying lead 105 to the corresponding electrode pad 106 is roughly 0.05 second, which is very short. Thus, even if 30 flying leads 105 have to be bonded, the length of time heat is allowed to conduct to the flying leads 105 is roughly 1.5 seconds. Therefore, it does not occur that the flying leads 105, which are heated until the ILB process is started, increase in temperature to a level high enough for bonding, before they begin to be bonded. Therefore, even though some of the flying leads 105, which are higher in the order in which they are bonded, may deviate in position by the time the bonding procedure ends, the amount of their positional deviation is small enough to generate virtually no stress in the junction while the junction is allowed to cool after the completion of the ILB process, and after the junction becomes normal in temperature.

Basically, it is at a normal temperature level that the semiconductor element chip 101 is used after it is placed, as one of the components, in an apparatus employing semiconductors element chip. That is, the ILB process in this embodiment does not subject the semiconductor element chip 101 to high temperature such as the temperature to which the ILB process in accordance with the prior art subjects the semiconductor element chip 101. That is, when the flying leads 105 of the semiconductor element chip 101 are bonded to the electrode pads of the flexible wiring sheet 102, with the use of the bonding method described above, there is virtually no chance that the electrical junction between the semiconductor element chip 101 and flexible wiring sheet 102 is subjected to stress. In other words, the inner lead bonding method in this embodiment can improve an apparatus employing the semiconductor element chip 101 and flexible wiring sheet 102, in terms of the reliability of the electrical junction between the semiconductor element chip 101 and flexible wiring sheet 102.

Figure 3:
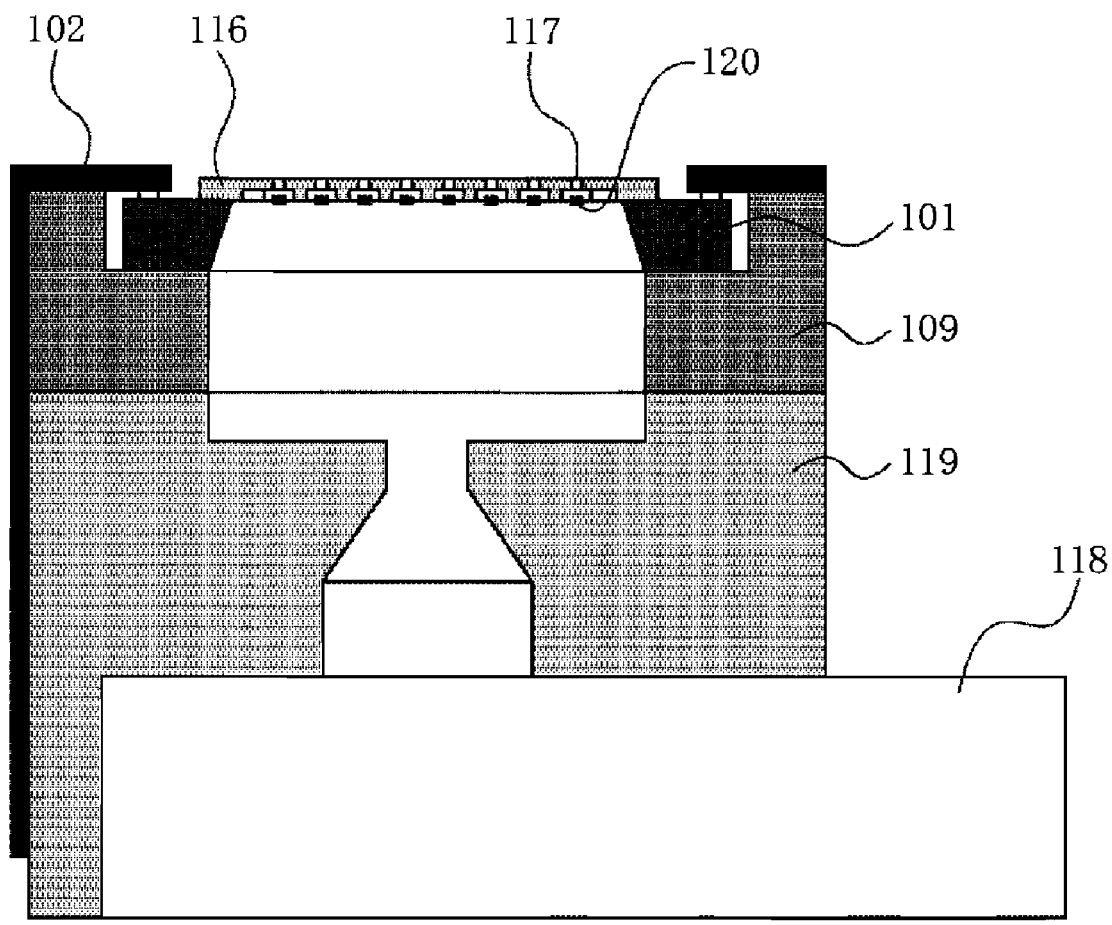
FIG. 3 is a schematic sectional view of an ink jet head.

One of the examples of an apparatus to which this embodiment of the present invention can be applied is an ink jet head, which is mounted in a printer shown in FIG. 3, or the like.

The ink jet head shown in FIG. 3 is made up of the semiconductor element chip 101, and a liquid passage formation member 116 placed on the topside of the semiconductor element chip 101. The liquid passage formation member 116 has rows of liquid jetting holes 117 through which droplets of recording liquid, such as ink, are jetted. The liquid passage formation member 116 is positioned so that its liquid jetting holes 117 face the liquid jetting energy generating elements (heaters 120 made of heat generating resistor), one for one. The ink jet head has also the supporting member 109 for supplying recording liquid to the semiconductor element chip 101 (recording chip), and the flexible wiring sheet 102, in addition to the semiconductor element chip 101 as a recording chip. The flexible wiring sheet 102 is the component for applying electrical pulses to each of the liquid ejection energy generating elements to make the recording liquid jet from the ink jet head. Further, the ink jet head is provided with an ink supplying unit 119 for supplying recording liquid from each of color ink containers 118 to the supporting member 109.

Regarding the semiconductor element chip employed by the ink jet head, the portion of the electric circuit, which is for supplying electric power to each liquid ejection heater 120, which is an example of the element for causing the ink jet head to jet out ink droplets, is different from the portion of the electric circuit, which is for supplying electric power to the electrode 111 of the inner lead bonding heater 110. That is, the semiconductor element chip 101 is structured so that the portion of the electric circuit, which is for supplying the inner lead bonding heater 111 with electric power, does not create any problem that affects the function of an ink jetting product when the product is in use.

As described above, the usage of the ILB method in this embodiment can offer the effects, such as those described above, even when it is used for bonding the flying leads for supplying the recording chip of the above described ink jet head with the electric power for driving the recording elements, to the electrodes of the recording chip.

Embodiment 2

Figure 4A:
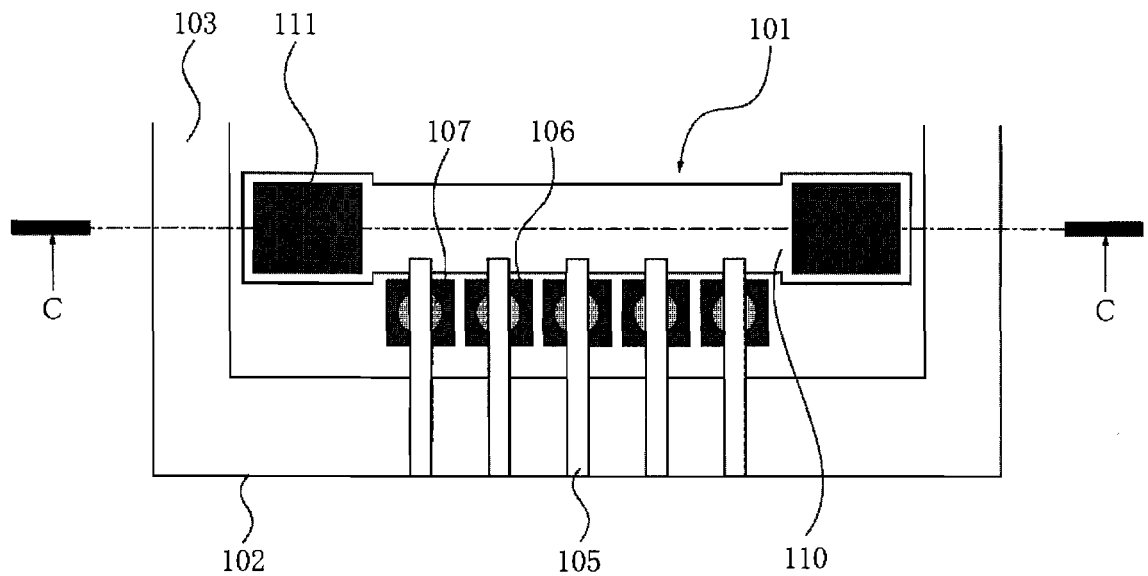
FIG. 4 is a schematic drawing for describing the second preferred embodiment of the present invention.
Figure 4B:
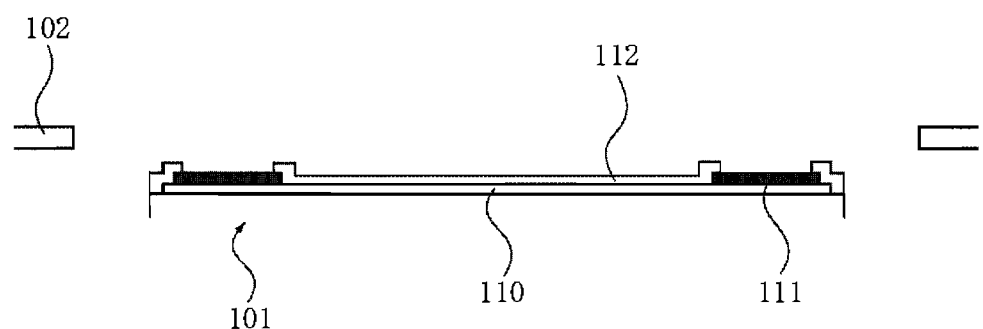

FIG. 4 is a drawing for describing the second preferred embodiment of the present invention. In this embodiment, the inner lead bonding heater 110 is placed on the substrate of the semiconductor element chip 101 so that the heater 110 is immediately next to the electrode pads 106 of the semiconductor element chip 101, instead of being directly below the electrode pads 106. FIG. 4A is a plan view of the electrical junction between the semiconductor element chip 101 and flexible wiring sheet 102, and FIG. 4B is a sectional view of the electrical junction at a line C-C in FIG. 4B. Also in this embodiment, the electrode bonding heater 110 is positioned in an area in which the heater 110 can heat the electrode pads 106 to a temperature level at which the electrode pads 106 and inner leads 105 can be satisfactorily bonded to each other, one for one, without derogatorily affecting the functions of the semiconductor element chip 101. The method, in this embodiment, for bonding the flying leads 105 to the corresponding electrode pads 106 is the same as that in the first embodiment.

The ILB bonding method in this embodiment does not require that the electrode pads 106 and the electrical wiring to be connected to the electrode pads 106 are formed on the dielectric layer 112. Therefore, it is unnecessary to take into consideration the state of contact between each electrode pad 106 and the dielectric layer 112, state of the coverage of the step between the electrical wiring and the edge of the dielectric layer 112, that is, the factors which affect the reliability of an apparatus employing the semiconductor element chip 101.

Further, in the case where this embodiment is used to manufacture an ink jet head, the ink jetting heater 120 and electrode bonding heater 110 can be formed of the same material, at the same time. In other words, this embodiment can reduce the number of ink jet head manufacturing steps, and also, can simplify the ink jet head manufacturing process.

Embodiment 3

Figure 5:
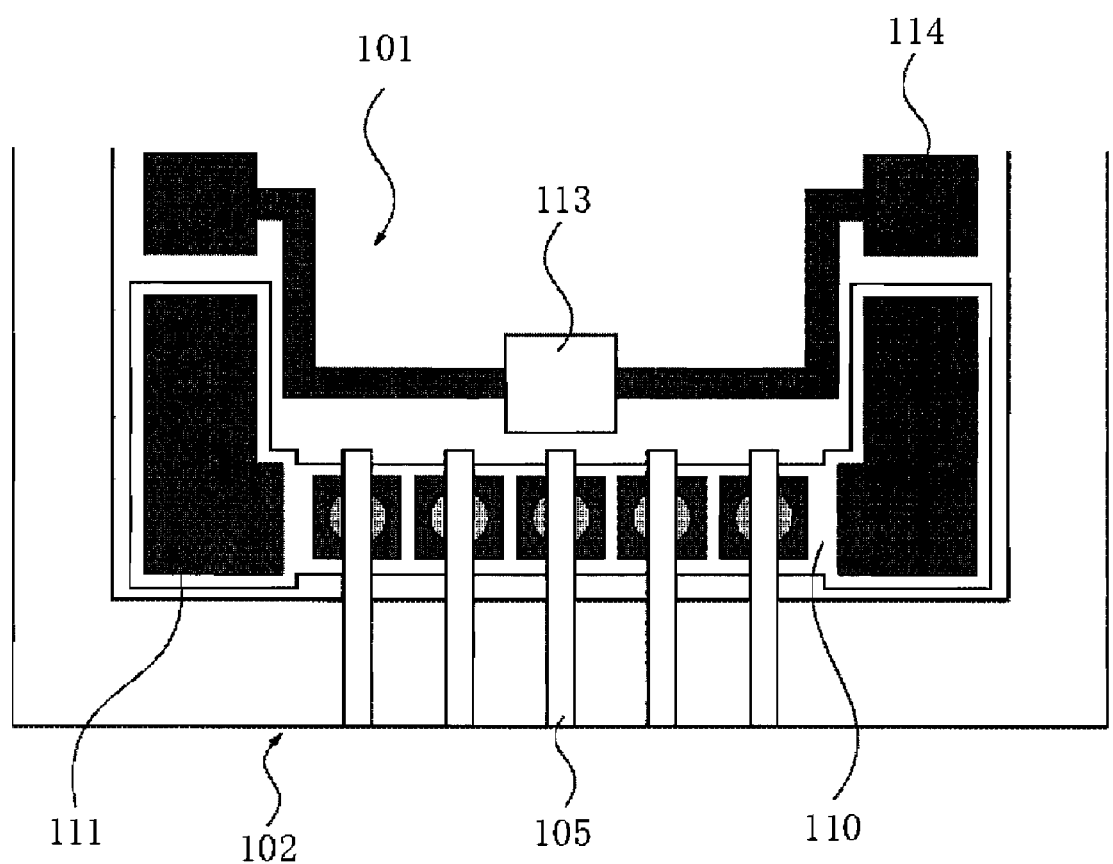
FIG. 5 is a schematic drawing for describing the third preferred embodiment of the present invention.

FIG. 5 is a drawing for describing the third preferred embodiment of the present invention. In this embodiment, a temperature detecting means 113, such as a temperature sensing diode or the like is placed next to the area where the electrode pads 106 are located. The method, in this embodiment, for bonding the flying leads 105 to the electrode pads 106, one for one, is the same as that in the first embodiment.

In the case of this embodiment, the temperature detecting means 113 is provided as the means for making it easier to control the temperature of the electrical junction while the junction is heated by the electrode bonding heater 110. The output signal from the temperature detecting means 113 is outputted from the electrode 114 of the temperature detecting means 113. Based on the temperature level of the electrical junction, which is detected by the temperature detecting means 113, the temperature of the electrical junction can be controlled by controlling (continuing or stopping) the electric power supply to the heater 110, so that the temperature of the electrical junction remains in the range for satisfactory electrode bonding. If it is necessary because of the thermal characteristic of the temperature detecting means 113, two or more temperature detecting means 113 may be employed.

The electrode bonding method in this embodiment also is compatible with the semiconductor element chip which is used as the recording chip of the ink jet head.

Embodiment 4

Figure 6:
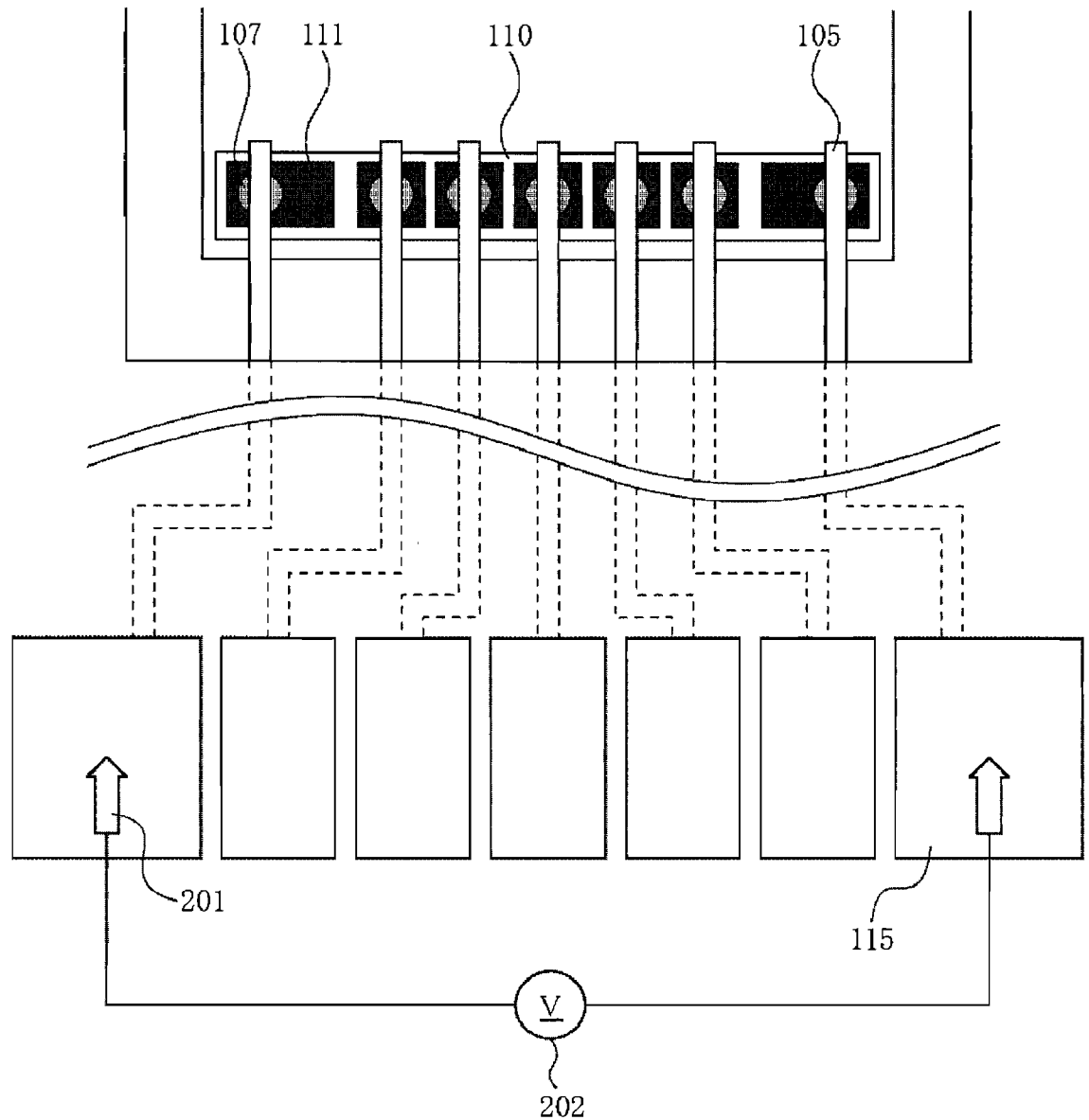
FIG. 6 is a schematic drawing for describing the fourth preferred embodiment of the present invention.

FIG. 6 is a drawing for describing the fourth preferred embodiment of the present invention. In this embodiment, the terminal 115 through which voltage is applied to the electrode bonding heater 110 of the semiconductor element chip 101 is formed as a part of the group of the external terminals of the flexible wiring sheet 102. This group of outer terminals of the flexible wiring sheet 102 is the group of electrode pads through which electrical signals, electric power, etc., are supplied to the electrode pads 106 of the semiconductor element chip 101. The method, in this embodiment, for bonding the flying leads 105 to the electrode pads 106, one for one, is the same as that in the first embodiment.

In the case of this embodiment, the flying leads 105 are bonded to the electrodes 111 of the electrode bonding heater 105 before the electrode pads 106 and flying leads 105 are bonded one for one. Voltage is applied to the electrode bonding heater 110 from an external electric power source through the terminal 115.

This embodiment also is compatible with the semiconductor element chip usable as the recording chip of an ink jet head.

This embodiment is useful when the electrode 115 for supplying the electrode bonding heater 110 of the semiconductor element chip 101 with electric power cannot be formed on the substrate of the semiconductor element chip 101 because of the available space on the substrate, or the electrode 115 is reduced in size so much that the area of contact between the electrode 115 and the electrode contacting portion 201 of the ILB apparatus 200 is insufficient in size.

Embodiment 5

Figure 7A:
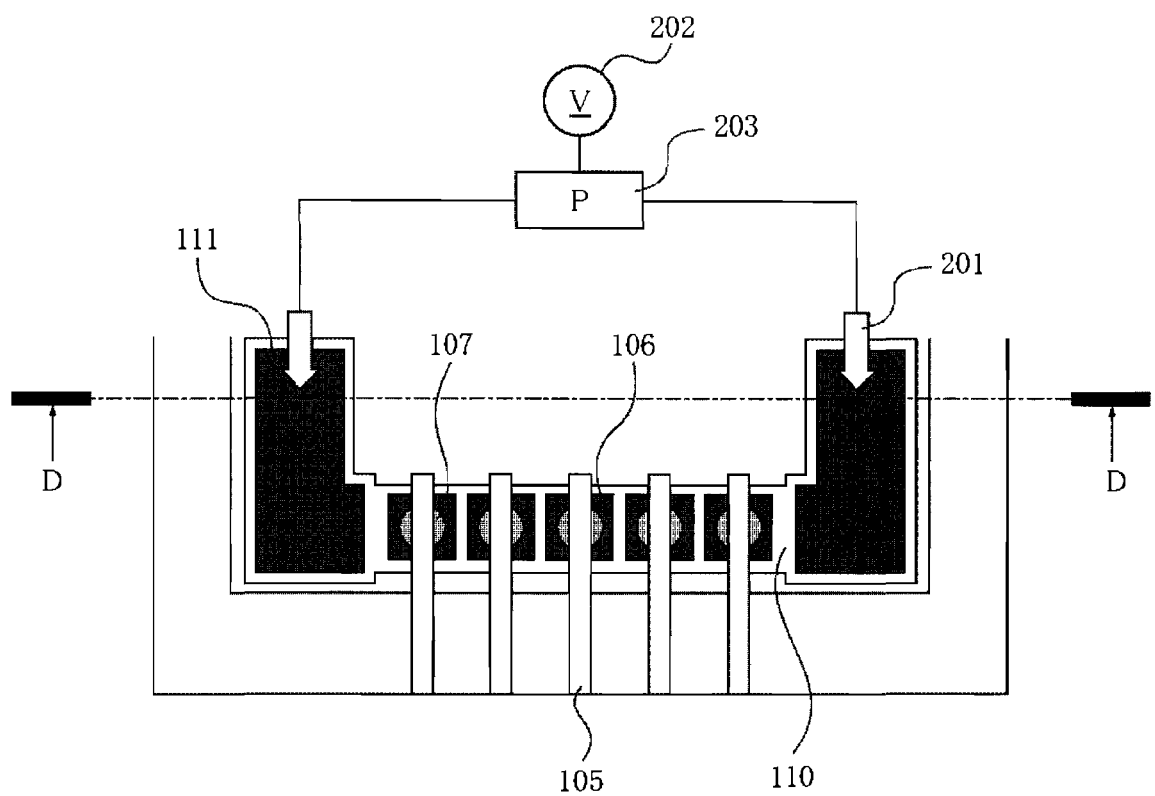
FIG. 7 is a schematic drawing for describing the fifth preferred embodiment of the present invention.
Figure 7B:
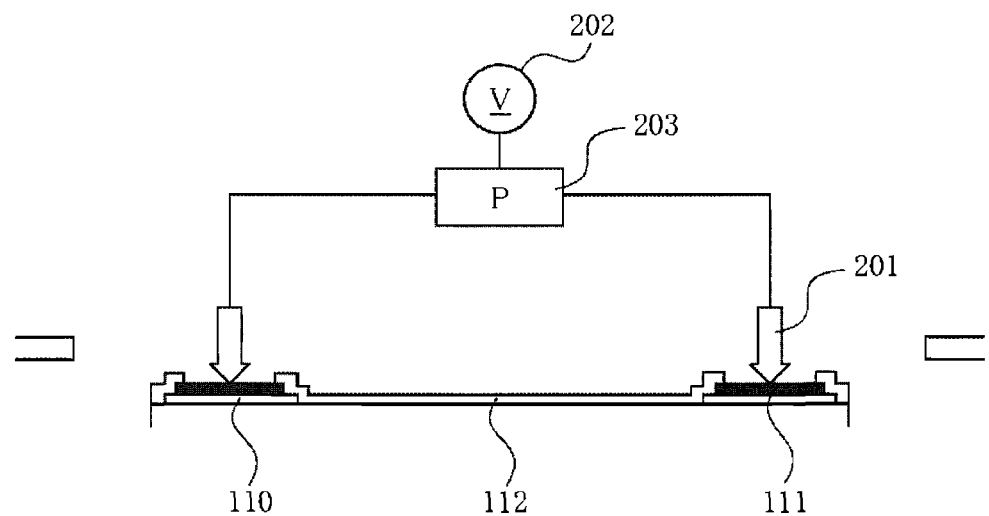
Figure 8A:
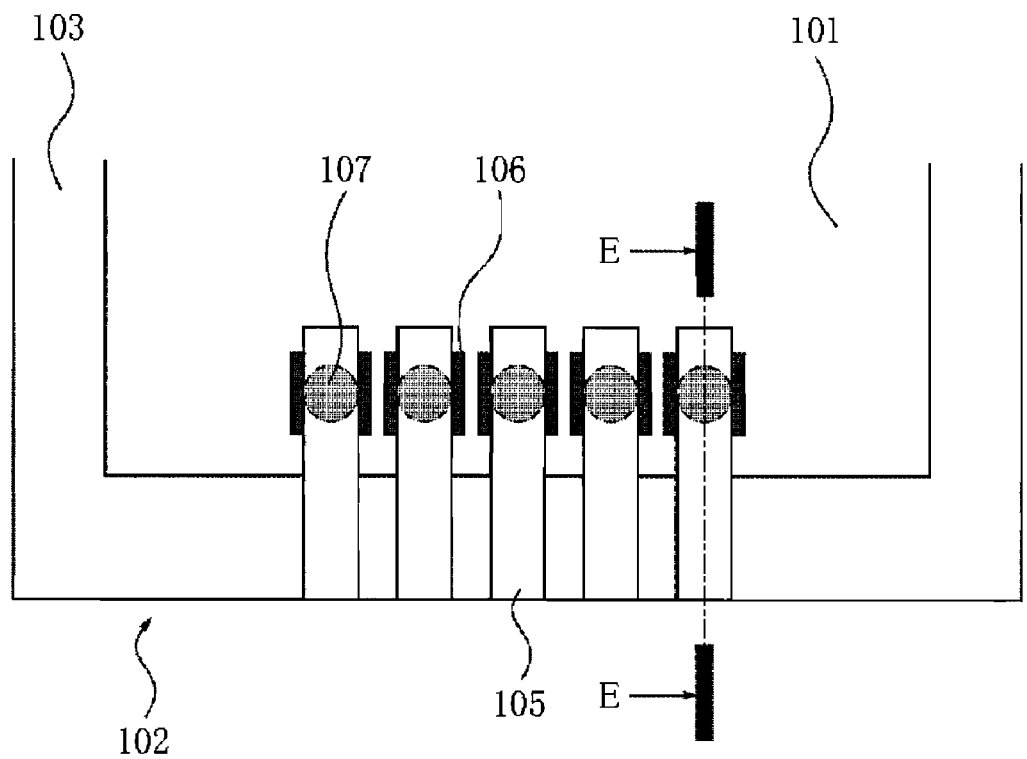
FIG. 8 is a schematic drawing of the electrical junction between the electrode pads and flying leads (inner leads), in a conventional apparatus employing a semiconductor element chip.
Figure 8B:
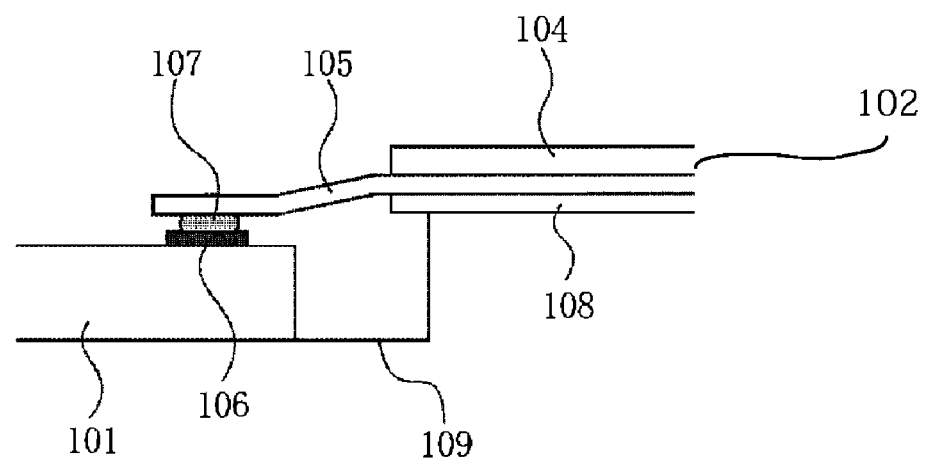

FIG. 7 is a drawing for describing the fifth preferred embodiment of the present invention. In this embodiment, the voltage to be applied to the electrode bonding heater 110 through the electrode 111 of the heater 110 is applied in the form of pulse signals. FIG. 7A is a plan view of the electrical junction between the semiconductor element chip 101 and flexible wiring sheet 102, and FIG. 7B is a sectional view of the electrical junction, at a line D-D in FIG. 7A.

Referring to FIGS. 7A and 7B, the ILB apparatus 200 is structured so that a voltage converting unit 203 is placed between the electric power source 200 and electrode contacting portion 201. The method, in this embodiment, for bonding the flying leads 105 to the electrode pads 106, one for one, is the same as that in the first embodiment.

This embodiment also is compatible with a semiconductor element chip used as the recording chip of an ink jet head.

This embodiment makes it possible to keep constant the voltage applied to the electrode bonding heater 110, making it easier to keep the temperature of the electrode bonding heater 110 at a preset level. More concretely, the temperature of the electrode bonding heater 110 is likely to fluctuate even after it reaches the preset level. This embodiment makes it easier to keep the amount of this temperature fluctuation within a preset range, by setting in advance the pulse signal length, based on the thermal properties of the electrode bonding heater 110.

The present invention, which was described above using the first to fifth preferred embodiments of the present invention, forms an electrode bonding heater, which is a heat generating resistor dedicated to the bonding of electrodes, on the substrate of a semiconductor element chip, with the use of a film formation technology, and bonds the flying leads (inner leads) of a flexible wiring sheet to the electrode pads of the semiconductive chip while keeping the electrode pads heated with the electrode bonding heater. However, the flying leads are not heated until immediately before the actual bonding of the flying leads. Therefore, it is possible to bond the flying leads while there is virtually no deformation of the flying leads, which is attributable to the thermal expansion of the flying leads. Therefore, even after the electrical junction between the semiconductive chip and flexible wiring sheet has cooled down to the normal temperature, there is virtually no stress in the electrical junction, making it unlikely for any of the flying leads of the flexible wiring sheet to separate from the corresponding electrode pad of the semiconductive chip. That is, the present invention can improve in reliability, the electrical junction between the semiconductive chip and flexible wiring sheet.

While the invention has been described with reference to the structures disclosed herein, it is not confined to the details set forth, and this application is intended to cover such modifications or changes as may come within the purposes of the improvements or the scope of the following claims.

This application claims priority from Japanese Patent Application No. 328707/2007 filed Dec. 20, 2007 which is hereby incorporated by reference.

What is claimed is:

1. An ink jet head comprising:
   a member provided with an ejection outlet for ejecting liquid;
   a substrate connected with said member, said substrate being provided with an element for generating energy for ejecting the liquid, an electrode pad electrically connected with said element, and a heater for heating said electrode pad; and
   an electric wiring member provided with a contact electrically connecting with said electrode pad.

2. An ink jet head according to claim 1, wherein said heater is provided below said electrode pad with an electrical insulation layer.

3. An ink jet head according to claim 1, wherein said heater is provided at a side of said electrode pad along a surface of said substrate.

* * * * *